(12) United States Patent
Geng et al.

(10) Patent No.: US 12,470,176 B2
(45) Date of Patent: Nov. 11, 2025

(54) DOHERTY AMPLIFIER

(71) Applicant: Ampleon Netherlands B.V., Nijmegen (NL)

(72) Inventors: Zhi Geng, Nijmegen (NL); Yi Zhu, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 384 days.

(21) Appl. No.: 18/176,218

(22) Filed: Feb. 28, 2023

(65) Prior Publication Data

US 2023/0283239 A1 Sep. 7, 2023

(30) Foreign Application Priority Data

Mar. 1, 2022 (NL) .................................. 2031122

(51) Int. Cl.
*H03F 1/02* (2006.01)
*H03F 1/56* (2006.01)
*H03F 3/21* (2006.01)

(52) U.S. Cl.
CPC ............. *H03F 1/0288* (2013.01); *H03F 1/56* (2013.01); *H03F 3/211* (2013.01); *H03F 2200/222* (2013.01); *H03F 2200/387* (2013.01); *H03F 2200/451* (2013.01)

(58) Field of Classification Search
CPC ........... H03F 3/211; H03F 1/565; H03F 3/213
USPC .............................................. 330/124 R, 295
See application file for complete search history.

(56) References Cited

U.S. PATENT DOCUMENTS

| | | | |
|---|---|---|---|
| 11,050,388 B2 * | 6/2021 | Wang ...................... | H03F 3/195 |
| 2015/0340306 A1 | 11/2015 | Komposch et al. | |
| 2022/0247360 A1 * | 8/2022 | Hampel .................... | H04B 1/40 |

OTHER PUBLICATIONS

Press release | Product news: RF transistor delivers > 50 % efficiency at 150 W DVB-T for ultra wideband asymmetrical Doherty applications, Reference: APN007 | Date: Mar. 8, 2016 (Year: 2016).*
Search Report and Written Opinion, Application No. NL 2031122, dated Oct. 16, 2022, 10 pages.

* cited by examiner

*Primary Examiner* — Hafizur Rahman
(74) *Attorney, Agent, or Firm* — McDonnell Boehnen Hulbert & Berghoff LLP

(57) ABSTRACT

Example embodiments relate to Doherty amplifiers. One Doherty amplifier includes a packaged main amplifier that includes a main input lead for receiving a main RF signal, a main power transistor for amplifying the main RF signal, and a main output lead for outputting the main RF signal amplified by the main power transistor. The Doherty amplifier also includes a packaged peak amplifier that includes a peak input lead assembly for receiving a peak RF signal, a first peak power transistor configured for amplifying a part of the peak RF signal, a second peak power transistor configured for amplifying a remaining part of the peak RF signal, and a peak output lead for combining the part of the peak RF signal amplified by the first peak power transistor and the remaining part of the peak RF signal amplified by the second peak power transistor into an amplified peak RF signal.

19 Claims, 2 Drawing Sheets

DOHERTY AMPLIFIER

CROSS-REFERENCE TO RELATED APPLICATIONS

The present application is a non-provisional patent application claiming priority to Netherlands Patent Application No. NL 2031122, filed Mar. 1, 2022, the contents of which are hereby incorporated by reference.

FIELD OF THE DISCLOSURE

The present disclosure relates to a Doherty amplifier. The present disclosure further relates to a packaged amplifier that can be used in such amplifier.

BACKGROUND

Doherty amplifiers are known in the art. An example of a known Doherty amplifier includes a printed circuit board. A Doherty splitter is arranged on and/or at least partially realized in the printed circuit board and is configured for receiving an RF signal and for splitting the received RF signal into a main RF signal and a peak RF signal. A packaged main amplifier is mounted on the printed circuit board that includes a main input lead for receiving the main RF signal, a main power transistor configured for amplifying the main RF signal, and a main output lead configured for outputting the main RF signal amplified by the main power transistor. Furthermore, a packaged peak amplifier is mounted on the printed circuit board that includes a peak input lead assembly for receiving the peak RF signal, a first peak power transistor configured for amplifying a part of the peak RF signal, a second peak power transistor configured for amplifying a remaining part of the peak RF signal, and a peak output lead for combining the part of the peak RF signal amplified by the first peak power transistor and the remaining part of the peak RF signal amplified by the second peak power transistor into an amplified peak RF signal.

Doherty amplifiers may further include a Doherty combiner arranged on and/or at least partially realized in the printed circuit board and configured for combining the amplified main RF signal and the amplified peak RF signal into an RF output signal and for outputting the RF output signal.

Benefiting from the high-power density of GaN technology, base stations RF power amplifier transistors have now been trending towards a small single package with a high-power capability.

SUMMARY

A high-power GaN transistor normally requires a large gate periphery in order to deliver sufficient power. For example, for a 700 W+ device, the total gate width required for the peak path of the Doherty amplifier can be even close to 60 mm.

A GaN semiconductor die on which a power transistor is integrated that has a large gate periphery usually introduces many challenges in both product development and industrialization. For example, the yield of such semiconductor dies can be relatively low. A dual semiconductor die configuration presents a solution for this problem.

Using large periphery devices introduces the risk of unwanted oscillations. Furthermore, when using a dual power transistor solution, push-pull type of oscillations may occur.

The present disclosure provides a Doherty amplifier in which at least one of these stability concerns are addressed. To this end, a Doherty amplifier is provided in accordance with claim 1. In the Doherty amplifier according to the present disclosure the peak output lead has an inner edge facing the first and second peak power transistors, and an outer edge arranged opposite to the inner edge. The peak output lead includes a slot that extends from the inner edge towards to outer edge and that has a length corresponding to A times a wavelength at an operational frequency of the Doherty amplifier, wherein A lies in a range from 0.1 to 0.4.

The slot divides the peak output lead in a first part, a second part, and a common part. The first part is electrically connected to the first peak power transistor, and the second part is electrically connected to the second peak power transistor. The common part is arranged between the outer edge and the first and second parts and is integrally connected to the first and second parts.

The slot ensures that the part of the peak RF signal amplified by the first peak power transistor combines with the part of the peak RF signal amplified by the second peak power transistor in the common part.

The slot may have a length between $\frac{1}{8}$ and $\frac{1}{4}$ times a wavelength at or close to the operational frequency.

The Applicant has found that by using the slot, the risk of push-pull type of oscillations can be minimized or at least lowered. This is at least in part due to the increased inductance associated with the paths from the outputs of the first and second peak power transistors to the common part of the peak output lead. The increased inductance causes the small-signal loop gain of the circuit including the first peak power transistor and second peak power transistor to be lowered, thereby improving the stability of the Doherty amplifier.

The present application particularly relates to asymmetric Doherty amplifiers operating in a frequency range between 1 GHz and 5 GHz and outputting power at levels exceeding 100 W (e.g., 300 W). The asymmetry of the Doherty amplifier, expressed as a ratio between the saturated output power of the peak amplifier and the saturated output power of the main amplifier, may exceed 1.5:1 (e.g., 2:1).

Typically, each of the packaged main amplifier and packaged peak amplifier may include a substrate on which the main power transistor, first peak power transistor, and second peak power transistor are mounted. Typically, these substrates are conductive and also function as heat sink. The various leads are fixated relative to the substrate. This can be achieved using an isolator that is arranged in between the substrate and the leads. Alternatively, a body of solidified molding compound keeps the leads and the substrate spaced apart. Furthermore, each of the packaged main amplifier and packaged peak amplifier may include a lid to shield the various components that are inside the package. This lid may also include a solidified molding compound. In some packages, the molding compound used for the lid is the same molding compound as the molding compound that fixates the leads and the substrate. Furthermore, in some embodiments a cavity exists in the package that surrounds the power transistor(s). Alternatively, in some embodiments the molding compound encapsulates all the components inside the package.

In an embodiment, the packaged main amplifier is packaged separately from the packaged peak amplifier. However, in other embodiments, the main power transistor, the first peak power transistor, and the second peak power transistor are combined in a single package.

The first peak power transistor can be integrated on a first semiconductor die and the second peak power transistor can be integrated on a second semiconductor die separate from the first semiconductor die. The present disclosure does however not exclude embodiments wherein the first peak power transistor and the second peak power transistor are integrated on the same semiconductor die. In some embodiments, the first peak power transistor and the second peak power transistor are different parts of a large power transistor that is arranged on a single semiconductor die. Furthermore, the main power transistor can be integrated on a third semiconductor die separate from the first and second semiconductor die.

The packaged main amplifier may include an input matching network arranged in between the main input lead and the main power transistor, and/or an output matching network arranged in between the main power transistor and the main output lead. The input matching network may include one or more impedance matching stages in which the relatively low input impedance of the main power transistor is transformed to a higher impedance seen at the main input lead. The output matching network may also include an impedance matching stage that transforms the relatively low output impedance to a higher level seen at the main output lead. The output matching network may alternatively or additionally include a shunt network that includes a series combination of an inductor and a capacitor. This latter network may be configured to resonate with the output capacitance of the main power transistor at or close to the operational frequency of the Doherty amplifier.

Similarly, the packaged peak amplifier may include a first input matching network arranged in between the peak input lead assembly and the first peak power transistor, and/or a first output matching network arranged in between the first peak power transistor and the peak output lead. Additionally or alternatively, the packaged peak amplifier may include a second input matching network arranged in between the peak input lead assembly and the second peak power transistor, and/or a second output matching network arranged in between the second peak power transistor and the peak output lead.

Each of the first and second input matching networks may have the same functionality as the input matching network of the packaged main amplifier. Similarly, each of the first and second output matching networks may have the same functionality as the output matching network of the packaged main amplifier.

The Doherty amplifier may further include a plurality of first bondwires connecting an input of the main power transistor to the main input lead either directly or via the input matching network, and/or a plurality of second bondwires connecting an output of the main power transistor to the main output lead either directly or via the output matching network. Similarly, the Doherty amplifier may further a plurality of third bondwires connecting an input of the first peak power transistor to the peak input lead assembly either directly or via the first input matching network, and/or a plurality of fourth bondwires connecting an input of the second peak power transistor to the peak input lead assembly either directly or via the second input matching network. Similarly, the Doherty amplifier may include a plurality of fifth bondwires connecting an output of the first peak power transistor to the first part of the peak output lead either directly or via the first output matching network, and/or a plurality of sixth bondwires connecting an output of the second peak power transistor to the second part of the peak output lead either directly or via the second output matching network.

The peak input lead assembly may include a first peak input lead and a second peak input lead spaced apart from the first peak input lead, wherein the first peak input lead is connected to the input of the first peak power transistor using the third plurality of bondwires, and wherein the second peak input lead is connected to the input of the second peak power transistor using the fourth plurality of bondwires. The connection using the third and fourth pluralities of bondwires may be a direct connection or an indirect connection, for example via the abovementioned first and second input matching network, respectively.

Furthermore, the Doherty splitter may include an input for receiving the RF signal, a main output for outputting the main RF signal, and a peak output for outputting the peak RF signal. In this case, the Doherty amplifier may include a first transmission line arranged in between the peak output and the first peak input lead, and a second transmission line arranged in between the peak output and the second peak input lead, wherein the first and second transmission lines each have an electrical length that corresponds to B times a wavelength at the operational frequency of the Doherty amplifier, wherein B lies in a range between 0.4 and 0.6. In some embodiments, the first and second transmission lines each have an electrical length that corresponds to a quarter wavelength at or close to half the operational frequency.

The Applicant has found that by using the first and second transmission lines, sub-harmonic oscillations associated with the voltage dependent input capacitance of the first peak power transistor and second peak power transistor can at least be partially suppressed. Such suppression can be further enhanced by having a resistor electrically connected between the first and second peak input leads.

The Doherty combiner may include an impedance inverter arranged in between a single output of the main power transistor or one of multiple outputs of the main power transistor and a combining node of the Doherty combiner. The impedance inverter can be formed by a quarter wavelength transmission line corresponding to the operational frequency or an electrical equivalent thereof. A phase delay between a or the output of the first peak power transistor and the combining node may substantially equal $n_1$ times 180 degrees at the operational frequency, and a phase delay between a or the output of the second peak power transistor and the combining node may substantially equal $n_2$ times 180 degrees at the operational frequency, wherein $n_1$ and $n_2$ are each an integer larger than zero.

The Doherty amplifier may include a phase delay arranged in between the Doherty splitter and the peak input lead assembly that is configured to ensure that the amplified main RF signal and the amplified peak RF signal combine in-phase at the combining node of the Doherty combiner.

According to a second aspect, the present disclosure provides a packaged amplifier that is configured to be mounted on a printed circuit board, and that includes an input lead assembly for receiving a RF signal, a first power transistor configured for amplifying a part of the RF signal, a second power transistor configured for amplifying a remaining part of the RF signal, and an output lead for combining the part of the RF signal amplified by the first power transistor and the remaining part of the RF signal amplified by the second power transistor into an amplified RF signal. The output lead has an inner edge facing the first and second power transistors, and an outer edge arranged opposite to the inner edge, wherein the output lead includes a slot extending from the inner edge towards to outer edge having a length corresponding to A times a wavelength corresponding to an operational frequency of the packaged amplifier, wherein A lies in a range from 0.1 to 0.4.

The slot divides the output lead in a first part, a second part, and a common part, wherein the first part is electrically connected to the first power transistor, wherein the second part is electrically connected to the second power transistor, and wherein the common part is arranged between the outer edge and the first and second parts and is integrally connected to the first and second parts. The slot ensures that the part of the RF signal amplified by the first transistor combines with the part of the RF signal amplified by the second transistor in the common part. The slot may have a length between ⅛ and ¼ times a wavelength at or close to the operational frequency.

The first power transistor can be integrated on a first semiconductor die and the second power transistor can be integrated on a second semiconductor die separate from the first semiconductor die.

According to a third aspect, the present disclosure provides a packaged amplifier that is configured to be mounted on a printed circuit board. It includes a main amplifier including a main input lead for receiving a main RF signal, a main power transistor configured for amplifying the main RF signal, and a main output lead configured for outputting the main RF signal amplified by the main power transistor. It further includes a peak amplifier including a peak input lead assembly for receiving a peak RF signal, a first peak power transistor configured for amplifying a part of the peak RF signal, a second peak power transistor configured for amplifying a remaining part of the peak RF signal, and a peak output lead for combining the part of the peak RF signal amplified by the first peak power transistor and the remaining part of the peak RF signal amplified by the second peak power transistor into an amplified peak RF signal.

The peak output lead has an inner edge facing the first and second peak power transistors, and an outer edge arranged opposite to the inner edge, wherein the peak output lead includes a slot extending from the inner edge towards to outer edge having a length corresponding to A times a wavelength corresponding to an operational frequency of the packaged peak amplifier, wherein A lies in a range from 0.1 to 0.4.

The slot divides the output lead in a first part, a second part, and a common part, wherein the first part is electrically connected to the first power transistor, wherein the second part is electrically connected to the second power transistor, and wherein the common part is arranged between the outer edge and the first and second parts and is integrally connected to the first and second parts. The slot ensures that the part of the RF signal amplified by the first power transistor combines with the part of the peak RF signal amplified by the second power transistor in the common part. The slot may have a length between ⅛ and ¼ times a wavelength at or close to the operational frequency.

The first peak power transistor can be integrated on a first semiconductor die, the second peak power transistor can be integrated on a second semiconductor die separate from the first semiconductor die, and the main power transistor can be integrated on a third semiconductor die separate from the first and second semiconductor die.

The packaged amplifiers according to the second and third aspect of the present disclosure can be used in the Doherty amplifier above. Consequently, any features described in connection with that Doherty amplifier may equally apply to the packaged amplifiers according to the second and third aspect of the present disclosure.

BRIEF DESCRIPTION OF THE DRAWINGS

Next, the present disclosure will be described referring to the appended drawings, wherein identical or similar components are referred to using identical reference signs, and wherein.

DETAILED DESCRIPTION

Figure 1:
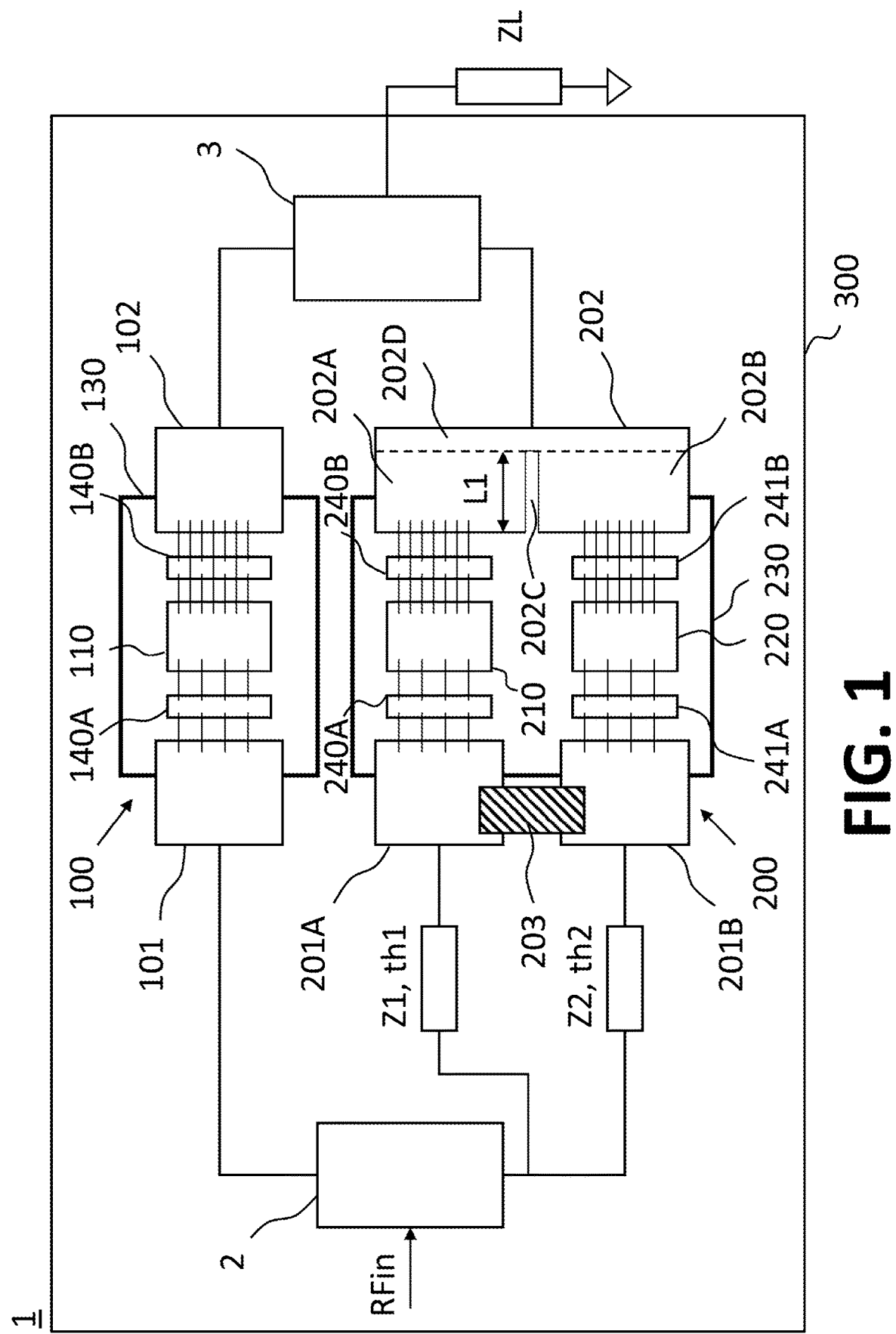
FIG. 1 illustrates a Doherty amplifier in which a packaged amplifier according to the second aspect of the present disclosure is used, according to example embodiments.

FIG. 1 illustrates a Doherty amplifier 1, according to example embodiments. It includes a packaged main amplifier 100 and a packaged peak amplifier 200 that are both mounted on a printed circuit board 300. Doherty amplifier 1 includes a Doherty splitter 2 that receives an RF input signal RFin and splits this signal into a main RF signal and a peak RF signal. Doherty splitter 2 can for example be a hybrid coupler, and/or may include a plurality of transmission line segments and/or lumped electrical components.

Doherty splitter 2 has a main output that is connected to main input lead 101 of packaged main amplifier 100, and a peak output that is connected to first peak input lead 201A of packaged peak amplifier 200 via a transmission line having characteristic impedance Z1 and electrical length th1, and to second peak input lead 201B of packaged peak amplifier 200 via a transmission line having characteristic impedance Z2 and electrical length th2. Alternatively, Doherty splitter 2 has two dedicated peak outputs for separately connecting to first peak input lead 201A and second peak input lead 201B using the abovementioned transmission lines.

The transmission lines are realized in printed circuit board 300. Alternatively, lumped equivalents are used, such as L-C-L or C-L-C networks having a comparable performance at half the operational frequency. Electrical lengths th1 and th2 may correspond to a quarter wavelength at half the operational frequency. Impedances Z1 and Z2 may be in the range between 40 and 70 Ohm.

Doherty amplifier 1 further includes a resistor, such as a surface mount device, SMD, resistor 203 mounted between first peak input lead 201A and second peak input lead 201B.

Packaged main amplifier 100 includes a semiconductor die 110 on which a main power transistor is integrated. Similarly, packaged peak amplifier 200 includes a first semiconductor die 210 on which a first peak power transistor is integrated, and a second semiconductor die 220 on which a second peak power transistor is integrated. Packaged main amplifier 100 may further include a substrate 130 and packaged peak amplifier 200 may include a substrate 230. Substrates 130, 230 may for example include a copper heat sink or the like and may function as an electrical ground during operation.

Packaged main amplifier 100 includes a main output lead 102 and packaged peak amplifier 200 includes a peak output lead 202. As shown, peak output lead 202 includes a first part 202A, a second part 202B spaced apart from first part 202A by a slot 202C, and a common part 202D that is integrally connected to first part 202A and second part 202B.

Here, the boundary between parts 202A, 202B and common part 202D is indicated using a hashed line.

Slot 202C has a length L1 that lies in between 0.1 and 0.4 times a wavelength at the operational frequency of the Doherty amplifier. This length typically corresponds to ⅛ to ¼ times the wavelength at the operational frequency of the Doherty amplifier. For example, when operating around 2 GHz, the slot may be 5 to 6 mm long and has a width in between 0.5 and 1 mm.

The main power transistor, and the first and second peak power transistor may each be based on Gallium Nitride field-effect transistors, FETs, or on Silicon based laterally diffused metal-oxide-semiconductor transistors, LDMOS, although other transistor types and/or semiconductor material systems are not excluded. Furthermore, a typical range of operational frequencies extends from 1 to 5 GHz.

Packaged main amplifier 100 includes a passive semiconductor die 140A arranged in between main input lead 101 and semiconductor die 110. More in particular, passive semiconductor die 140A may include one or more capacitors, which together with bondwires, form impedance matching stage(s). The bondwires form part of a first plurality of bondwires, indicated using straight lines in FIG. 1. Some of the bondwires extend between main input lead 101 and passive semiconductor die 140A, and some of the bondwires extend between passive semiconductor die 140A and the input of the main power transistor.

Similarly, packaged main amplifier 100 includes a passive semiconductor die 140B arranged in between semiconductor die 110 and main output lead 102. This die may include a grounded capacitor of which the non-grounded terminal is connected via bondwires to the output of the main power transistor on semiconductor die 110. In this manner a shunt network is formed including a series combination of an inductor and a capacitor. At the operational frequency, the shunt network behaves as an inductor that resonates with the output capacitor of the main power transistor. As shown, the output of the main power transistor is also directly connected to main output lead 102 using bondwires that form part of a second plurality of bondwires. Other topologies are not excluded, for example topologies in which passive semiconductor die 140B includes additional capacitors for forming, together with bondwires, one or more impedance matching stages between the output of the main power transistor and main output lead 102. In general, the circuitry in between the output of the main power transistor and main output lead 102 is referred to as output matching network.

As shown, similar networks are provided in packaged peak amplifier 200 using passive semiconductor dies 240A, 240B, 241A, 241B. However, in this case, some of the bondwires corresponding to the first peak power transistor arranged on first semiconductor die 210 are connected to first part 202A of peak output lead 202, whereas some of the bondwires corresponding to the second peak power transistor arranged on second semiconductor die 220 are connected to second part 202B of peak output lead 202.

Figure 2:
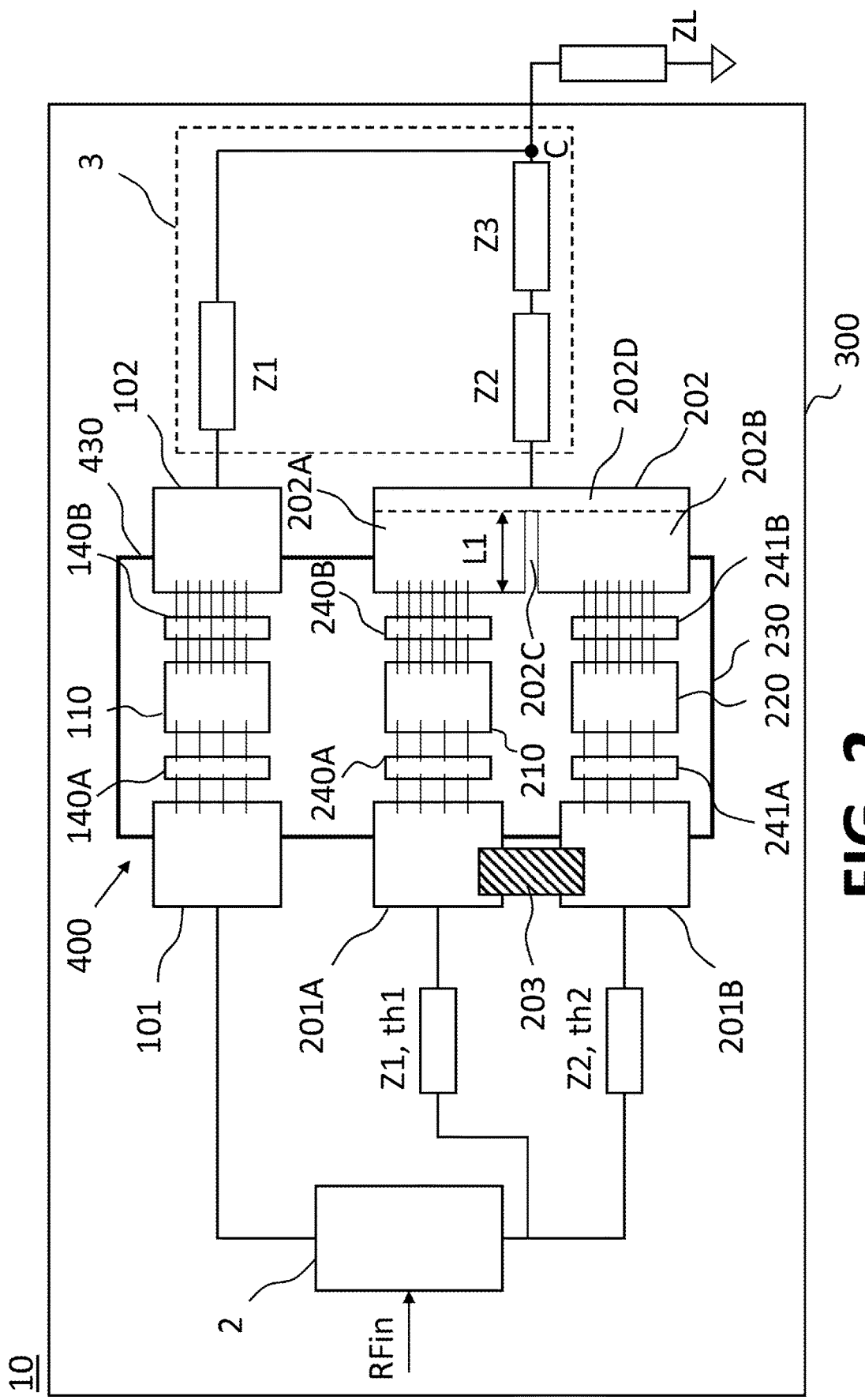
FIG. 2 illustrates a Doherty amplifier in which a packaged amplifier according to the second aspect of the present disclosure is used, according to example embodiments.

Peak output lead 202 and main output lead 102 are connected using a Doherty combiner 3, which combines the amplified main signal received from main output lead 102 and the amplified peak signal received from peak output lead 202 into an RF output signal. For example, Doherty combiner 3 may include an impedance inverter arranged in between the output of the main power transistor and a combining node C, which is shown in FIG. 2. Impedance inverter can be realized using a quarter wavelength transmission line on printed circuit board 300. Alternatively, the impedance inverter is realized using discrete elements arranged on printed circuit board 300. In an even further embodiment, the impedance inverter is formed taking into account the bondwires and parasitic effects of the package.

Typically, Doherty combiner 3 provides an integer times 180 degrees phase delay between the output of the first and second peak power transistors and combining node C. Such phase delay can be partially realized using transmission lines on printed circuit board 300.

Combining node C, which either forms the output of Doherty amplifier 1 or is connected to the output of Doherty amplifier 1, optionally through one or more impedance inverters and/or other impedance matching stages, can be connected to a load ZL.

Doherty splitter 2 introduces a suitable phase delay such that at the operational frequency, the signals amplified by the main power transistor and by the first peak power transistor and by the second peak power transistor add up in-phase at combining node C.

In FIG. 1, two separate packages 100, 200 are shown. In Doherty amplifier 10 shown in FIG. 2, the main power transistor, and the first and second peak power transistors have been combined in a single package 400. The components shown in FIG. 1 are equally used in the embodiment of FIG. 2, with the exception of the substrates that have been replaced by a single substrate 430.

Furthermore, Doherty combiner 3 is represented by an impedance inverter Z1, an impedance inverter Z3, and an offset line Z2. Typically, these components are at least partially realized on the printed circuit board. As described above, the required phase delays for Doherty operation may at least partially be realized inside package 400.

Various Doherty configurations are possible. It is noted that the present disclosure is not limited to a particular configuration. For example, the present disclosure equally relates to a regular Doherty configuration, an inverted Doherty configuration, or a parallel Doherty configuration. These configurations differ mostly in the manner in which Doherty combiner 3 is realized.

In the above, the present disclosure has been described using detailed embodiments thereof. However, the present disclosure is not limited to these embodiments. Instead, various modifications are possible without deviating from the scope of the present application, which is defined by the appended claims and their equivalents.

What is claimed is:

1. A Doherty amplifier, comprising:
   a packaged main amplifier comprising:
      a main input lead for receiving a main RF signal;
      a main power transistor configured for amplifying the main RF signal; and
      a main output lead configured for outputting the main RF signal amplified by the main power transistor;
   a packaged peak amplifier comprising:
      a peak input lead assembly for receiving a peak RF signal;
      a first peak power transistor configured for amplifying a part of the peak RF signal;
      a second peak power transistor configured for amplifying a remaining part of the peak RF signal; and
      a peak output lead for combining the part of the peak RF signal amplified by the first peak power transistor and the remaining part of the peak RF signal amplified by the second peak power transistor into an amplified peak RF signal; and
   a Doherty combiner configured for:
      combining the amplified main RF signal and the amplified peak RF signal into an RF output signal; and outputting the RF output signal,
wherein the peak output lead comprises:
an inner edge facing the first and second peak power transistors;
an outer edge arranged opposite to the inner edge; and
a slot extending from the inner edge towards the outer edge and having a length corresponding to A times a wavelength at an operational frequency of the Doherty amplifier, wherein A lies in a range from 0.1 to 0.4,
wherein the slot divides the peak output lead in a first part, a second part, and a common part,
wherein the first part is electrically connected to the first peak power transistor,
wherein the second part is electrically connected to the second peak power transistor,
wherein the common part is:
arranged between the outer edge and the first and second parts; and
integrally connected to the first and second parts, and
wherein the slot ensures that the part of the peak RF signal amplified by the first peak power transistor combines with the part of the peak RF signal amplified by the second peak power transistor in the common part.

2. The Doherty amplifier according to claim 1, further comprising:
a printed circuit board on which the packaged main amplifier and the packaged peak amplifier are mounted; and
a Doherty splitter:
arranged on and/or at least partially realized in the printed circuit board; and
configured for:
receiving an RF signal; and
splitting the received RF signal into the main RF signal and the peak RF signal,
wherein the Doherty combiner is arranged on and/or at least partially realized in the printed circuit board.

3. The Doherty amplifier according to claim 1, wherein the main power transistor, the first peak power transistor, and the second peak power transistor are combined in a single package.

4. The Doherty amplifier according to claim 1,
wherein the first peak power transistor is integrated on a first semiconductor die, and
wherein the second peak power transistor is integrated on a second semiconductor die separate from the first semiconductor die.

5. The Doherty amplifier according to claim 4, wherein the main power transistor is integrated on a third semiconductor die separate from the first and second semiconductor die.

6. The Doherty amplifier according to claim 1, wherein the packaged main amplifier comprises:
an input matching network arranged in between the main input lead and the main power transistor; and/or
an output matching network arranged in between the main power transistor and the main output lead.

7. The Doherty amplifier according to claim 6, further comprising:
a plurality of first bondwires connecting an input of the main power transistor to the main input lead either directly or via the input matching network; and
a plurality of second bondwires connecting an output of the main power transistor to the main output lead either directly or via the output matching network.

8. The Doherty amplifier according to claim 1,
wherein the packaged peak amplifier comprises:
a first input matching network arranged in between the peak input lead assembly and the first peak power transistor; and/or
a first output matching network arranged in between the first peak power transistor and the peak output lead, and/or
wherein the packaged peak amplifier comprises:
a second input matching network arranged in between the peak input lead assembly and the second peak power transistor; and/or
a second output matching network arranged in between the second peak power transistor and the peak output lead.

9. The Doherty amplifier according claim 8, further comprising:
a plurality of third bondwires connecting an input of the first peak power transistor to the peak input lead assembly either directly or via the first input matching network;
a plurality of fourth bondwires connecting an input of the second peak power transistor to the peak input lead assembly either directly or via the second input matching network;
a plurality of fifth bondwires connecting an output of the first peak power transistor to the first part of the peak output lead either directly or via the first output matching network; and
a plurality of sixth bondwires connecting an output of the second peak power transistor to the second part of the peak output lead either directly or via the second output matching network.

10. The Doherty amplifier according to claim 9,
wherein the peak input lead assembly comprises a first peak input lead and a second peak input lead spaced apart from the first peak input lead,
wherein the first peak input lead is connected to the input of the first peak power transistor using the third plurality of bondwires, and
wherein the second peak input lead is connected to the input of the second peak power transistor using the fourth plurality of bondwires.

11. The Doherty amplifier according to claim 10, further comprising
a Doherty splitter:
arranged on and/or at least partially realized in a printed circuit board;
configured for:
receiving an RF signal; and
splitting the received RF signal into the main RF signal and the peak RF signal; and
comprising:
an input for receiving the RF signal;
a main output for outputting the main RF signal; and
a peak output for outputting the peak RF signal;
a first transmission line arranged in between the peak output and the first peak input lead; and
a second transmission line arranged in between the peak output and the second peak input lead,
wherein the first and second transmission lines each have an electrical length that corresponds to B times a wavelength corresponding to the operational frequency of the Doherty amplifier, and
wherein B lies in a range between 0.4 and 0.6.

12. The Doherty amplifier according to claim 10, further comprising a resistor electrically connected between the first and second peak input leads.

13. The Doherty amplifier according to claim 1,
wherein the Doherty combiner comprises an impedance inverter arranged in between a or the output of the main power transistor and a combining node of the Doherty combiner, and
wherein the impedance inverter is formed by a quarter wavelength transmission line corresponding to the operational frequency or an electrical equivalent thereof.

14. The Doherty amplifier according to claim 13,
wherein a phase delay between a or the output of the first peak power transistor and the combining node substantially equals n1 times 180 degrees at the operational frequency,
wherein a phase delay between a or the output of the second peak power transistor and the combining node substantially equals n2 times 180 degrees at the operational frequency, and
wherein n1 and n2 are each an integer larger than zero.

15. The Doherty amplifier according to claim 13, further comprising:
a Doherty splitter configured for:
receiving an RF signal; and
splitting the received RF signal into the main RF signal and the peak RF signal; and
a phase delay arranged in between the Doherty splitter and the peak input lead assembly, said phase delay being configured to ensure that the amplified main RF signal and the amplified peak RF signal combine in-phase at the combining node of the Doherty combiner.

16. A packaged amplifier configured to be mounted on a printed circuit board, and comprising:
an input lead assembly for receiving a RF signal;
a first power transistor configured for amplifying a part of the RF signal;
a second power transistor configured for amplifying a remaining part of the RF signal; and
an output lead for combining the part of the RF signal amplified by the first power transistor and the remaining part of the RF signal amplified by the second power transistor into an amplified RF signal,
wherein the output lead comprises:
an inner edge facing the first and second power transistors;
an outer edge arranged opposite to the inner edge; and
a slot extending from the inner edge towards the outer edge and having a length corresponding to A times a wavelength corresponding to an operational frequency of the packaged amplifier, wherein A lies in a range from 0.1 to 0.4,
wherein the slot divides the output lead in a first part, a second part, and a common part,
wherein the first part is electrically connected to the first power transistor,
wherein the second part is electrically connected to the second power transistor,
wherein the common part is:
arranged between the outer edge and the first and second parts; and
integrally connected to the first and second parts, and
wherein the slot ensures that the part of the RF signal amplified by the first power transistor combines with the part of the RF signal amplified by the second transistor in the common part.

17. The packaged amplifier according to claim 16,
wherein the first power transistor is integrated on a first semiconductor die, and
wherein the second power transistor is integrated on a second semiconductor die separate from the first semiconductor die.

18. A packaged amplifier configured to be mounted on a printed circuit board, and comprising:
a main amplifier comprising:
a main input lead for receiving a main RF signal;
a main power transistor configured for amplifying the main RF signal; and
a main output lead configured for outputting the main RF signal amplified by the main power transistor; and
a peak amplifier comprising:
a peak input lead assembly for receiving a peak RF signal;
a first peak power transistor configured for amplifying a part of the peak RF signal;
a second peak power transistor configured for amplifying a remaining part of the peak RF signal; and
a peak output lead for combining the part of the peak RF signal amplified by the first peak power transistor and the remaining part of the peak RF signal amplified by the second peak power transistor into an amplified peak RF signal,
wherein the peak output lead comprises:
an inner edge facing the first and second peak power transistors;
an outer edge arranged opposite to the inner edge; and
a slot extending from the inner edge towards the outer edge and having a length corresponding to A times a wavelength corresponding to an operational frequency of the packaged amplifier, wherein A lies in a range from 0.1 to 0.4,
wherein the slot divides the peak output lead in a first part, a second part, and a common part,
wherein the first part is electrically connected to the first peak power transistor,
wherein the second part is electrically connected to the second peak power transistor,
wherein the common part is:
arranged between the outer edge and the first and second parts; and
integrally connected to the first and second parts, and
wherein the slot ensures that the part of the peak RF signal amplified by the first peak power transistor combines with the part of the peak RF signal amplified by the second peak power transistor in the common part.

19. The packaged amplifier according to claim 18,
wherein the first peak power transistor is integrated on a first semiconductor die,
wherein the second peak power transistor is integrated on a second semiconductor die separate from the first semiconductor die, and
wherein the main power transistor is integrated on a third semiconductor die separate from the first and second semiconductor die.

* * * * *